(12) United States Patent
Bouten

(10) Patent No.: US 9,449,939 B2
(45) Date of Patent: Sep. 20, 2016

(54) GEOMETRY OF CONTACT SITES AT BRITTLE INORGANIC LAYERS IN ELECTRONIC DEVICES

(75) Inventor: Petrus Cornelis Paulus Bouten, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 449 days.

(21) Appl. No.: 13/496,221

(22) PCT Filed: Mar. 18, 2010

(86) PCT No.: PCT/IB2010/051168
§ 371 (c)(1),
(2), (4) Date: Mar. 15, 2012

(87) PCT Pub. No.: WO2011/033393
PCT Pub. Date: Mar. 24, 2011

(65) Prior Publication Data
US 2012/0175750 A1 Jul. 12, 2012

(30) Foreign Application Priority Data
Sep. 17, 2009 (EP) .................................... 09170517

(51) Int. Cl.
*H01L 29/40* (2006.01)
*H01L 23/00* (2006.01)
*H01L 51/52* (2006.01)

(52) U.S. Cl.
CPC ............. *H01L 24/48* (2013.01); *H01L 23/562* (2013.01); *H01L 24/05* (2013.01); *H01L 51/5206* (2013.01); *H01L 51/5237* (2013.01); *H01L 2224/04042* (2013.01); *H01L 2224/0569* (2013.01); *H01L 2224/05555* (2013.01); *H01L 2224/48463* (2013.01); *H01L 2251/5338* (2013.01); *H01L 2924/00014* (2013.01); *H01L 2924/014* (2013.01); *H01L 2924/0105* (2013.01); *H01L 2924/01006* (2013.01); *H01L 2924/01013* (2013.01); *H01L 2924/01014* (2013.01);
(Continued)

(58) Field of Classification Search
USPC ............................ 257/629, 91, 750, 748, 734
See application file for complete search history.

(56) References Cited

U.S. PATENT DOCUMENTS 6,279,227 B1 * 8/2001 Khandros et al. .............. 29/885
6,337,445 B1 * 1/2002 Abbott .............. H01L 23/49816
174/257

(Continued)

FOREIGN PATENT DOCUMENTS

JP 62011253 1/1987
JP 6211253 A 8/1994

(Continued)

OTHER PUBLICATIONS

Piet Bouten; "On the OCP Mechanical Properties", Holst Flexible OLED, OCP Properties, March 3, 2009, pp. 1-11.

*Primary Examiner* — Bradley K Smith
*Assistant Examiner* — David Goodwin

(57) ABSTRACT

An electronic device (10, 20, 30, 40) is provided which comprises a substrate (16) supporting an inorganic layer (11) and a joint (13), mechanically coupling a contacting element (14) to the inorganic layer (11). At least a first load distributing layer (12a) is arranged in direct contact with the inorganic layer (11) at a position of the joint (13) for relieving stress caused by an elastic mismatch between the substrate (16) and the inorganic layer (11).

11 Claims, 3 Drawing Sheets

(52) U.S. Cl.
CPC ........... H01L2924/01015 (2013.01); H01L 2924/01033 (2013.01); H01L 2924/01047 (2013.01); H01L 2924/01049 (2013.01); H01L 2924/01057 (2013.01); H01L 2924/01067 (2013.01); H01L 2924/01079 (2013.01); H01L 2924/05042 (2013.01); H01L 2924/12041 (2013.01); H01L 2924/12044 (2013.01); H01L 2924/19041 (2013.01)

(56) References Cited

U.S. PATENT DOCUMENTS

| | | |
|---|---|---|
| 7,026,547 B1 | 4/2006 | Goller et al. |
| 7,160,756 B2 * | 1/2007 | Kripesh et al. ............ 438/114 |
| 7,187,078 B2 * | 3/2007 | Lin et al. ................... 257/748 |
| 7,221,054 B2 * | 5/2007 | Minda ....................... 257/738 |
| 7,348,212 B2 | 3/2008 | Schiaffino et al. |
| 7,482,268 B2 * | 1/2009 | Lin et al. ................... 438/642 |
| 7,626,264 B2 * | 12/2009 | Yokoyama ................. 257/750 |
| 7,713,861 B2 * | 5/2010 | Yu ............................. 438/614 |
| 7,847,407 B2 * | 12/2010 | Watanabe .................. 257/773 |
| 8,138,079 B2 * | 3/2012 | Lee et al. .................. 438/614 |
| 8,227,916 B2 * | 7/2012 | Wei et al. .................. 257/737 |
| 8,618,649 B2 * | 12/2013 | Rathburn ................... 257/688 |
| 2002/0084528 A1 | 7/2002 | Kim et al. |
| 2003/0052327 A1 | 3/2003 | Kwasnick et al. |
| 2003/0062828 A1 | 4/2003 | Sugimoto et al. |
| 2005/0012211 A1 * | 1/2005 | Kung et al. ................ 257/734 |
| 2005/0168136 A1 | 8/2005 | Sugimoto et al. |
| 2006/0016861 A1 * | 1/2006 | Daubenspeck et al. . 228/180.21 |
| 2006/0055035 A1 * | 3/2006 | Lin ........................ H01L 24/10 257/737 |
| 2006/0091536 A1 | 5/2006 | Huang et al. |
| 2006/0169989 A1 | 8/2006 | Bhattacharya et al. |
| 2006/0292747 A1 * | 12/2006 | Loh ............................ 438/116 |
| 2007/0001301 A1 * | 1/2007 | Wang ......................... 257/734 |
| 2007/0075423 A1 * | 4/2007 | Ke et al. .................... 257/737 |
| 2008/0018243 A1 | 1/2008 | Ishiguro et al. |
| 2009/0042326 A1 * | 2/2009 | Yamazaki et al. ........... 438/29 |
| 2009/0174061 A1 * | 7/2009 | Naka et al. ................ 257/698 |
| 2011/0198733 A1 * | 8/2011 | Tomisaka et al. ......... 257/622 |
| 2012/0061823 A1 * | 3/2012 | Wu et al. ................... 257/737 |

FOREIGN PATENT DOCUMENTS

| | | |
|---|---|---|
| JP | 2002217227 A | 8/2002 |
| WO | 2011086500 A2 | 7/2011 |

* cited by examiner

GEOMETRY OF CONTACT SITES AT BRITTLE INORGANIC LAYERS IN ELECTRONIC DEVICES

FIELD OF THE INVENTION

The invention relates to electronic devices such as optoelectronic devices, solar cells, transistors and capacitors comprising a thin inorganic layer, such as a barrier layer or a functional inorganic layer.

BACKGROUND OF THE INVENTION

Thin inorganic layers are commonly used to provide barrier properties against moisture in electronic devices, such as for example in opto-electronic devices such as displays and lighting devices. In addition, thin inorganic layers are often used in electronic devices for transparent conductors, for instance ITO (Indium-tin oxide), photovoltaic layer (Si in solar cells), electrical isolation, or dielectric layer in for instance thin film transistors or capacitor structures, or passivation layers on top of an electronic device. The inorganic layers are often manufactured from for example silicon dioxide, silicon nitride or alumina.

For current electronic devices, barrier properties are achieved by arranging the thin inorganic layers in a multi-layer stack, consisting of several inorganic layers, or in a layer stack with alternating inorganic and (organic) polymer layers.

The barrier properties against moisture are limited by the water vapor transmission rate (WVTR). It is determined by intrinsic material permeation of the layers and the number of weak spots, such as pinholes and cracks within the inorganic layers. Hence, the layer stack must show very low concentration of cracks at service, otherwise moisture may diffuse to functional parts and cause reduced performance and failure of the device. This is a complex technical problem, since the inorganic layers used as barriers often are very thin and composed of materials which are brittle, and hence are susceptible for crack-formation resulting in penetration and exposure to moisture, which, in turn, causes decreased performance or failure of the electronic device. Also such brittle layer are often adjacent to relatively soft material layer causing even higher susceptibility for crack-formation.

Also, for other brittle inorganic layers in electronic devices, brittle layer such as transparent conductors, for instance ITO (Indium-tin oxide), photovoltaic layer (Si in solar cells), electrical isolation, or dielectric layer in for instance thin film transistors or capacitor structures or passivation layers on top of an electronic device are very sensitive to crack-formation. Especially, a technical problem is that cracks often form in inorganic layers close to a contact site.

Due to crack formation within in a functional layer the functionality of the layer is lost. For example, a crack in a barrier layer affects the barrier properties strongly, and a crack in a conducting layer might result is a significant change of the electrical performance of the device.

U.S. Pat. No. 7,348,212 shows an example of an electronic device comprising a contact site. The document describes a method for providing a semiconductor light emitting device wherein a light emitting layer is disposed between an n-type region and a p-type region and wherein contacts are electrically connected to the n-type region and the p-type region.

However, there is still a need in the art to improve the performance of brittle inorganic layers in electronic devices, especially for a brittle layer which is to be arranged with a contact site.

OBJECT OF THE INVENTION

It is an object of the present invention to at least partially overcome the above mentioned problems of the prior art and thus to provide an electronic device with improved lifetime. Further, an object of the invention is to reduce the probability of thin brittle layers to undergo crack initiation and crack propagation.

Furthermore, an object of the invention is to provide an electronic device which at the same time as providing improved resistance against crack formation, also allows for an increase service temperature range, lowered risk for deformation, and/or increased resistance against contact damage. Furthermore, an object of the invention is to reduce crack formation in inorganic layers which are added to a flexible polymer substrate.

SUMMARY OF THE INVENTION

According to a first aspect of the invention, this object is achieved by providing an electronic device comprising a substrate supporting an inorganic layer and a joint, mechanically coupling a contacting element to the inorganic layer, the electronic device further comprising at least a first load distributing layer arranged in direct contact with the inorganic layer, at a position of the joint for relieving stress caused by an elastic mismatch between the substrate and the inorganic layer.

The load distributing layer provides a reduction of the maximum strain in the adjacent inorganic layer which results in a reduced probability for crack initiation and propagation. Consequently, the risk for penetration of moisture is reduced. Also, the device according to the invention allows for an increased service temperature range of the device, since local maximum strain of the device caused by for example a joint and contact can be reduced. In addition, the risk for deformation, due to local mechanical influence was lowered. Therefore the long term performance is significantly improved. It is to be noted that the mechanical coupling may, and usually will, also result in an electrical coupling.

It has been found that the stress relieving ability of the load distributing layer strongly depends on the thickness of the load distribution layer. Preferably, the thickness $h_1$ of the first load distributing layer is defined by $E_1 h_1 \leq q\ E_0 h_1$, wherein $h_1$ and $h_1$ are the thickness of the inorganic layer and the first load distributing layer respectively, $E_1$ and $E_1$ are the Young moduli of the inorganic layer and the first load distributing layer respectively and q is a limiting number.

The product of the Young modulus E and the thickness h of a layer is also a measure of the tensile stiffness of said layer. The optimal thickness thus depends on the ratio of the tensile stiffness of the inorganic layer and the first load distributing layer. A suitable value for this ratio is obtained when $0 \leq q \leq 1.0$.

The first load distributing layer may either be arranged in between the inorganic layer and the joint or such that the inorganic layer is in between the at least a first load distributing layer and the joint. Preferred materials for the at least one load distributing layer are a metal, a semi-conductor, a polymeric material or a combination thereof.

Even better stress relief may be obtained by an electronic device comprising a stack of multiple load distributing layers, the stack comprising the first load distributing layer being arranged for relieving stress caused by an elastic mismatch between the substrate and the inorganic layer. When using a stack of load distributing layers, it can be assured that the difference in tensile stiffness of adjacent layers is not too large. Consequently, the risk of crack creation and propagation is minimized.

In the stack of load distributing layers a thickness $h_{x+1}$ of a load distributing layer, x+1, in the stack is preferably defined by $E_{x+1}h_{x+1} \leq q \sum_{j=0}^{x} E_j h_j$, wherein j=0 corresponds to the inorganic layer and $1 \leq j \leq x$ corresponds to the respective load distributing layers closer to the inorganic layer than the load distributing layer, x+1, wherein $h_j$ is the thickness and $E_j$ is the Young modulus of the corresponding layer and wherein q is a limiting number.

The optimal thickness of each layer thus depends on the ratio of the tensile stiffness of said layer and the sum of tensile stiffnesses of all previous layers, including the inorganic layer supported on the substrate. A suitable value for this ratio is obtained when $0 \leq q \leq 1.0$.

In the stack of load distributing layers, different layers do preferably not have the same dimensions. A suitably selected overlap between the edges of adjacent layers may further improve the stress relieving abilities of the stack of load distributing layers. Preferably a largest distance, $L_{x+1}$, between an edge of a load distributing layer x+1 and the edges of all layers closer to the inorganic layer is at least f $\sum_{j=1}^{x} h_j$, wherein f is defined by an elastic mismatch, α, between the substrate and the inorganic layer, wherein $f=f_0/(1-\alpha)^r f_0 \geq 2$, $\alpha=(E_0-E_s)/(E_0+E_s)$ and $0.5 \leq r \leq 0.75$, $E_s$ being the Young modulus of the substrate.

It is to be noted that the thickness of a layer is not necessarily the same for the whole layer. In practice, the thickness may, e.g., be smaller at the edge of the layer, than in the center. In a stacked layer configuration, the layer thickness may, e.g., be defined as the thickness of the layer at the position where it overlaps an adjacent layer. Alternatively, the thickness may be defined as an average thickness over the whole layer, as a thickness at a predetermined distance from the edge or as a thickness at the center of the layer.

An embodiment of the invention relates to an opto-electronic device comprising an electronic device according to the invention.

These and other aspects of the invention are apparent from and will be elucidated with reference to the embodiments described hereinafter.

DETAILED DESCRIPTION OF THE INVENTION

In the following detailed description, preferred embodiments of the invention will be described. However, it is to be understood that features of the different embodiments are exchangeable between the embodiments and may be combined in different ways, unless anything else is specifically indicated.

Figure 1A:
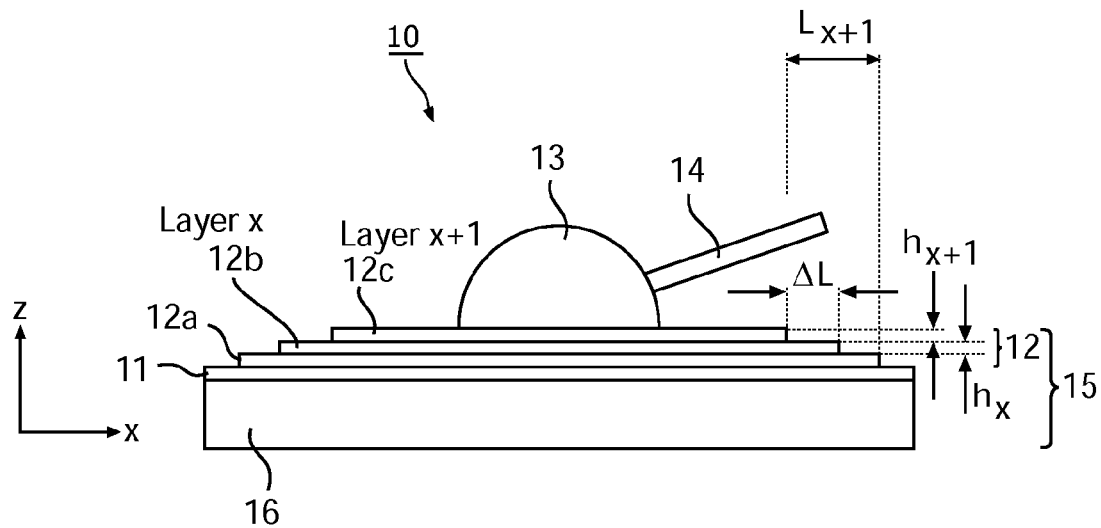
FIG. 1a shows a cross-sectional view of an embodiment of an electronic device according to the invention, wherein a load distributing layer stack is arranged between a first inorganic layer and a contact, wherein one of the layers in the layer stack is in direct contact with the first inorganic layer.

Referring to FIG. 1a, a first embodiment of the invention is illustrated, wherein a part 15 of an electronic device 10 comprises a first inorganic layer 11, which is brittle, and which is arranged on a substrate 16, for example a compliant layer made of polymeric material. A load distributing layer stack 12 is arranged on part of the inorganic layer 11 in order to interconnect a couple 14 to the inorganic layer 11, using a joint 13 situated on top of the load distribution layer 12.

According to the invention, the load distributing layer stack 12 is arranged in direct contact with the first inorganic layer 11. As used herein, direct contact between a first and second layer refers to the presence of at least one physical path from the first layer to the second layer, without crossing a third material or layer or a cavity. The load distributing layer stack 12 in FIG. 1a, covers at least a part of the inorganic layer 11 at the site of a contact. The load distributing layer stack 12 in FIG. 1a comprises one layer 12a which is in direct contact with the first inorganic layer 11, a layer X 12b and another layer X+1 12c. The layer X+1 12c is in direct contact with the layer X 12b, and the layer X 12b is arranged between the first inorganic layer 11 and the layer X+1 12c. Alternatively, the layer X may correspond to layer 12a and layer X+1 may correspond to layer 12c. The length of layer x 12b is different from the length of layer x+1 12c. Using a load distributing layer stack as described above resulted in improved distribution of local strain, thus significantly reducing the risk for crack initiation and propagation, due to that the distribution of local strain was found to be lowered using layers in the layer stack wherein two neighboring layers x and x+1 has a length difference according to above.

According to a further embodiment a largest distance, $L_{x+1}$, between an edge of a load distributing layer X+1 and the edges of all layers closer to the inorganic layer 11 is at least f times the total height of all previous load distributing layers and f is preferably above 10. It was found that by varying the length of the layers within this range, the redistribution of load was further lowered and the maximum strain can be significantly reduced. The factor f, may also be defined in relation to the elastic mismatch, α, between the substrate and the inorganic layer. For example, $f=f_0/(1-\alpha)^r$, wherein $f_0 \geq 2$, $\alpha=(E_0-E_s)/(E_0+E_s)$ and $0.5 \leq r \leq 0.75$, $E_s$ being the Young modulus of the substrate.

The load distributing layer 12 may be a single layer or a layer stack comprising 2 to, e.g., 10 layers. The load distributing layer 12 achieves distribution of local mechanical strain e.g. caused by a contact or a contacting component. The layers 12a, 12b, 12c in the load distributing layer stack in FIG. 1a are, e.g., made of a polymeric or inorganic material such as a semi-conducting or electronically conducting material such as metallic materials, such as Al, Au or Ag. The material composition of the layers in the load distributing layer stack may comprise combination of materials.

The thickness of the load distributing layers may be chosen in dependence of the height and/or Young moduli of the inorganic layer 11 and of any load distributing layer closer to the inorganic layer 11. Typically, the a load distributing layer may have a thickness in the range of from 20 nm to 1 µm, such as equal to or less than 0.3 µm. If the load distributing layer is a polymer layer it may also be thicker.

The inorganic layer 11 may, e.g., be for a barrier layer made of nitride, oxide such as silicon oxide, silicon nitride, silicon oxide-nitride, or alumina, or a mixtures or solid solutions thereof. The inorganic layer 11 may comprise various layers, where part of these layers might be patterned, e.g., with electronic structures, like TFTs (thin film transistors). Alternatively, the inorganic layer 11 may be a part of a laminate of inorganic and organic polymer layers. In cases where very thin (e.g. 30 nm-1 µm) inorganic layers 11 are used, the inorganic layer 11 may be composed of a non-stochiometric inorganic oxide or nitride compound formed by for example plasma enhanced chemical vapor deposition or suitable sputtering techniques. A barrier layer including the inorganic layer 11 may have a water vapor transmission rate (WVTR) of less than $10^{-2}$ g/m² per day. Preferably, the WVTR is less than $10^{-5}$ g/m² per day, such as less than $10^{-6}$ g/m² per day.

It was found that the load distributing layer stack 12 arranged at the inorganic layer 11 is useful for very thin inorganic layers, such as layers between 20 and 1000 nm. Also it was found to be very beneficial for inorganic layers 11, having a thickness which is equal to or below 100 nm.

The load distributing layer stack provides for a reduced maximum strain in the adjacent inorganic layer which results in that the probability for crack initiation and propagation is significantly reduced. Therefore, the risk for penetration of moisture is reduced. Also, the load distributing layer stack 12 allows for increased service temperature range of the device, since local maximum strain of the device caused by a joint 13 and contact 14 is reduced. In addition, the risk for deformation, due to local mechanical influence is lowered.

Furthermore, embodiments of the invention relate to electronic devices comprising a contact 14 attached with a joint 13 in contact to the load distributing layer 12. In FIG. 1a, the joint 13 is in direct contact with the inorganic layer 12c. The joint 13 may comprise an adhesive such as a glue or a solder. Hence, the joint may be formed of a polymer material binding the contact 14 to the load distributing layer 12, or may be formed of a metallic material.

The contact 14 may for example be an electrical wire to an anode or a cathode layer of the electronic device 10. Alternatively, the contact 14 and joint 13 may be a mechanical contact component which is used to provide connecting means between the electronic device 10 and a carrier structure. This may be the case for example when the electronic device 10 is an LED (Light Emitting Diode) or OLED (Organic Light Emitting Diode) which is arranged in a carrier structure such as a display or display element. In this case the contact may be formed of a material, such as a polymer or metallic material which physically connects the electronic device 10 to a carrier structure.

Especially, an advantageous embodiment is provided where the layer X+1 has a tensile stiffness ratio q in the range of 0<q<1. A more preferred embodiment q interval is 0≤q≤0.60, and an even more preferred interval is 0≤q≤0.30. The tensile stiffness ratio can be determined from $$\frac{E_{x+1}h_{x+1}}{\sum_{j=0}^{x} E_j h_j} < q,$$

in which E is the Young's modulus, h is the thickness, $E_{x+1}h_{x+1}$ is the tensile stiffness of layer x+1 and $$\sum_{j=0}^{x} E_j h_j$$

represents the sum of the tensile stiffness of the layers between layer X+1 and the inorganic layer, including the tensile stiffness of the inorganic layer 11.

Figure 1B:
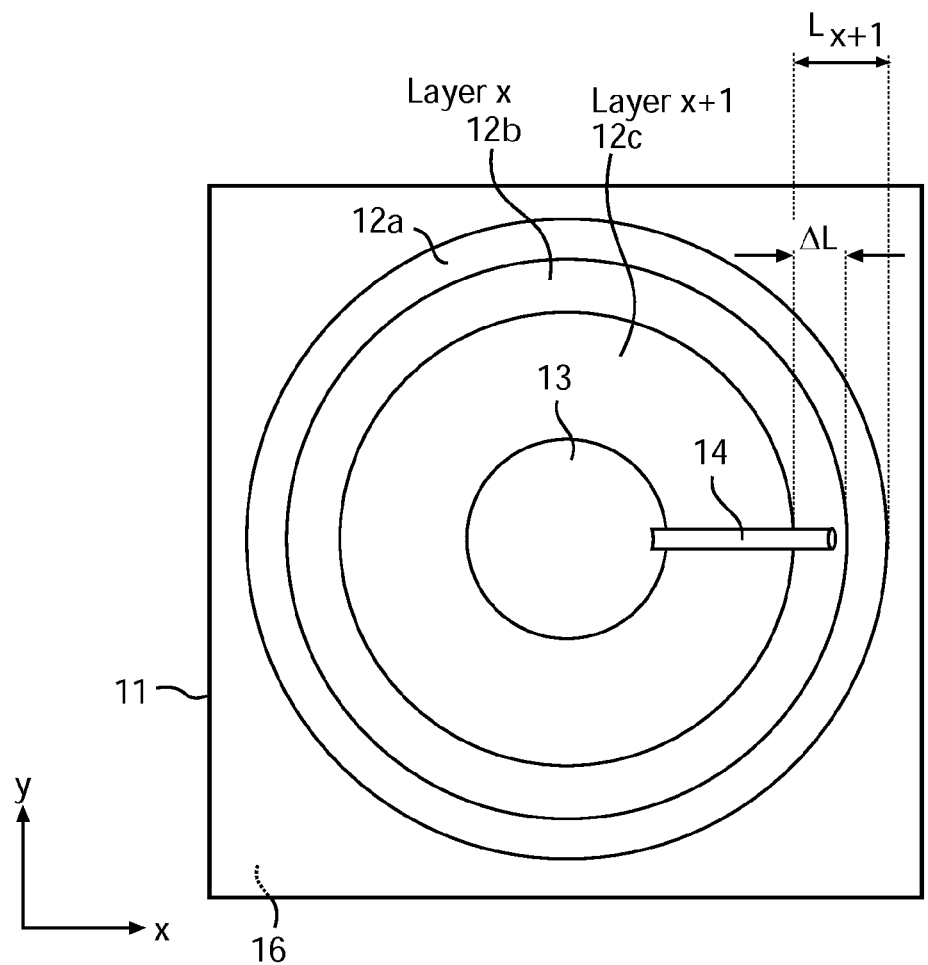
FIG. 1b shows the electronic device in FIG. 1a from the top (z-axis).
Figure 1C:
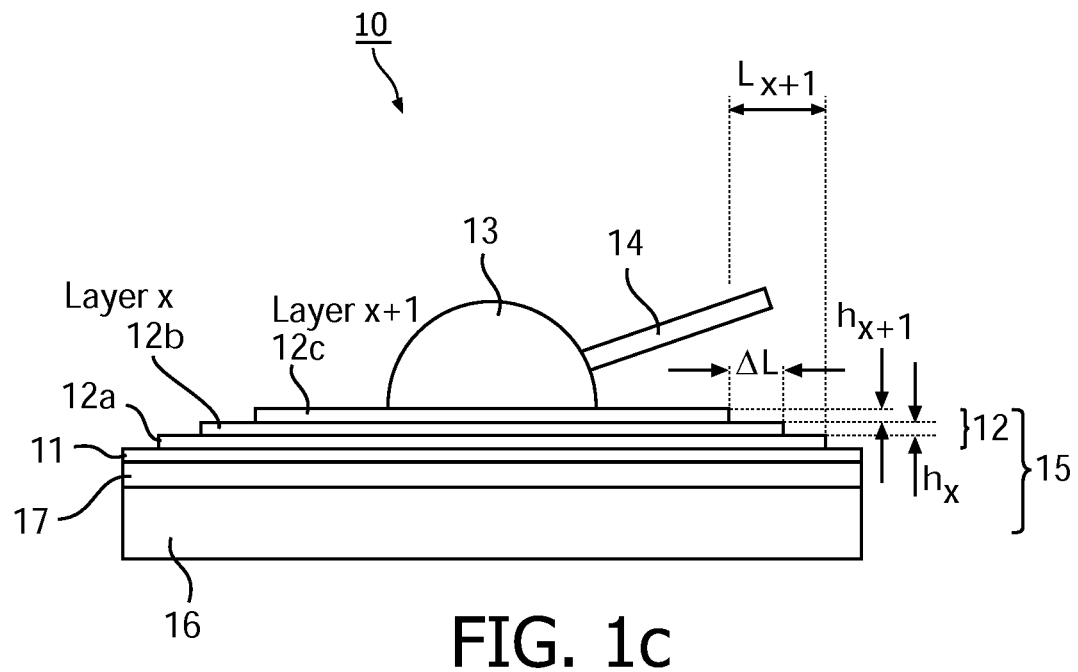
FIG. 1c shows a cross-sectional view of an electronic device further comprising a first polymer layer positioned directly in contact with the first inorganic layer.

As illustrated in FIG. 1c, the electronic device 10 further may comprise a first polymer layer 17 positioned directly in contact with the first inorganic layer 11. The polymer layer 17 may have a Young's modulus below for example 5 GPa, such as below, 500 MPa, 200 MPa, 100 MPa, 50 MPa or even 20 or 10 MPa. The thickness of the first polymer layer may for example be less than 100 µm, such as between 5 µm and 100 µm.

The electronic device 10 may further comprise a first polymer layer 17 positioned directly in contact with the first inorganic layer 11, and wherein the elastic mismatch α of the first inorganic layer and the substrate is in the range of from 0.8 to less than 1, such as from 0.85 to 0.995. The elastic mismatch α can be determined from $$\alpha = \frac{E'_{inorganic\ layer} - E'_{polymer\ layer}}{E'_{inorganic\ layer} + E'_{polymer\ layer}},$$

wherein E' denotes the effective Young's modulus for the first inorganic layer or the first polymer layer respectively.

Figure 5:
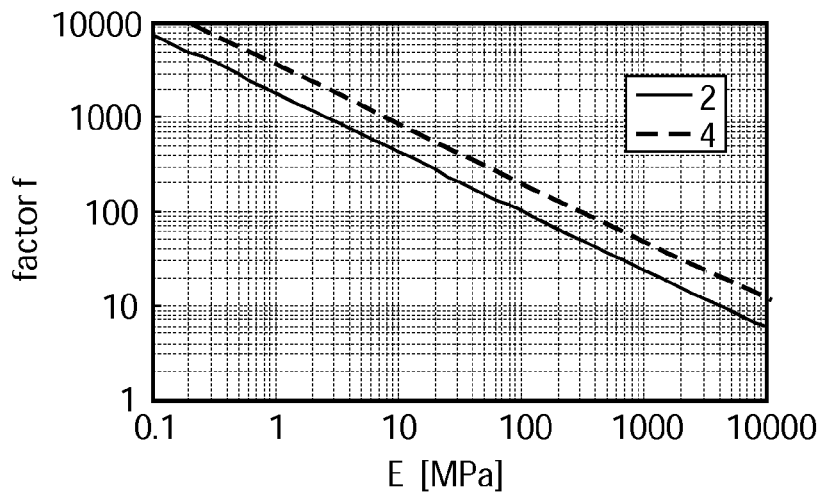

The FIG. 5 shows how f depends on Young's modulus of the compliant substrate, using E=100 GPa (=$10^5$ MPa) for the modulus of the layer. For most of these layers the moduli will be in the 50 GPa-400 GPa range. It results in quite high values of f for lower moduli supporting layers; for $f_0$=2 the following values are achieved:

E=1000 MPa f=24
E=100 MPa f=100,
E=10 MPa f=428.

Therefore, in some embodiments, f may suitably be above 50, such as above 100, or above 400.

Figure 2:
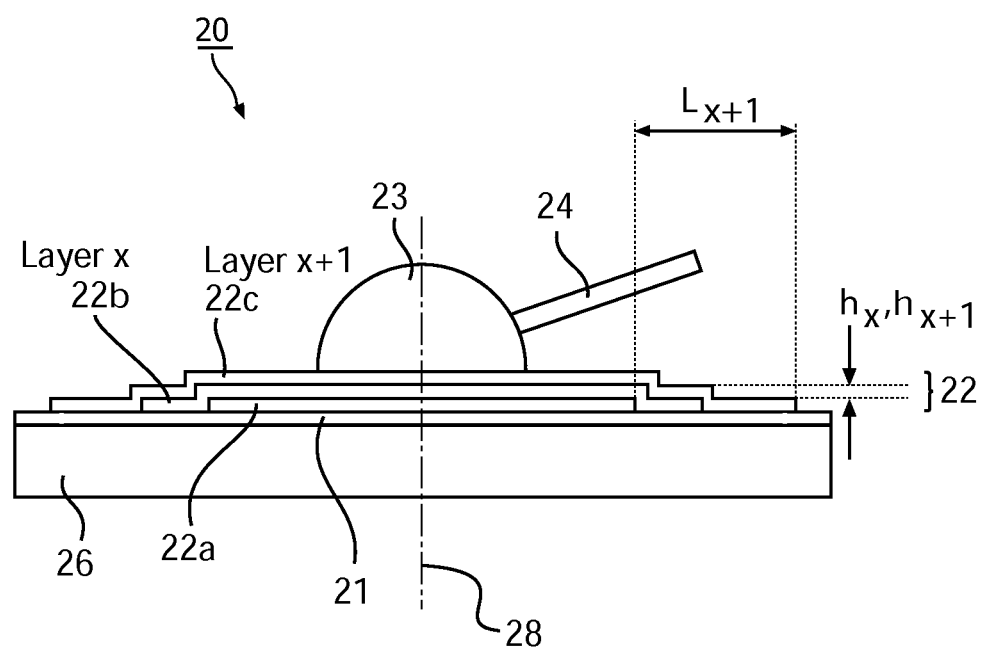
FIG. 2 shows a cross-sectional view of a part of an electronic device according to an embodiment of the invention, wherein a load distributing layer stack is arranged between an inorganic layer and a contact, wherein several of the layers in the layer stack is in direct contact with the first inorganic layer.

With reference to FIG. 2, a second embodiment of the electronic device 10 is illustrated, showing an electronic device 20 (which in contrast to the first embodiment illustrated in FIG. 1a), comprises a load distributing stack 22 wherein several of the layers 22a, 22b, 22c in the load distributing stack 22 are in direct contact with the inorganic layer 21 which is arranged on a substrate 26.

Figure 3:
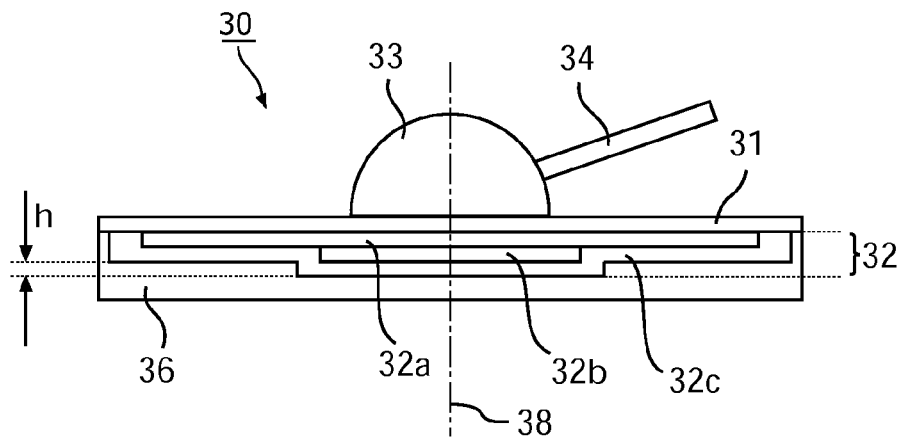
FIG. 3 shows a cross-sectional view of a part of an electronic device according to an embodiment of the invention, wherein a load distributing layer stack is arranged below an inorganic layer of the device.

With reference to FIG. 3, a third embodiment of the electronic device 30 is shown. In this embodiment, the load distributing layer stack 32 is arranged differently compared to the first and second embodiments. In FIG. 3 the load distributing stack 32 is arranged below the inorganic layer 31 (which is arranged on a substrate 36) so that a contact 34 and joint 33 arranged onto the electronic device 30, are arranged in direct contact with inorganic layer 31 above the load distributing layer stack 32. The load distributing layer stack 32 may comprise inorganic material as described above.

Further, alternative embodiments can relate to an electronic device constructed by combining the load distributing layer stack of FIG. 1 or 2 with the load distributing layer stack in FIG. 3. Hence, embodiments of the invention relates to using two load distributing layer stacks, wherein these are arranged on opposite sides of the brittle inorganic layer.

Figure 4:
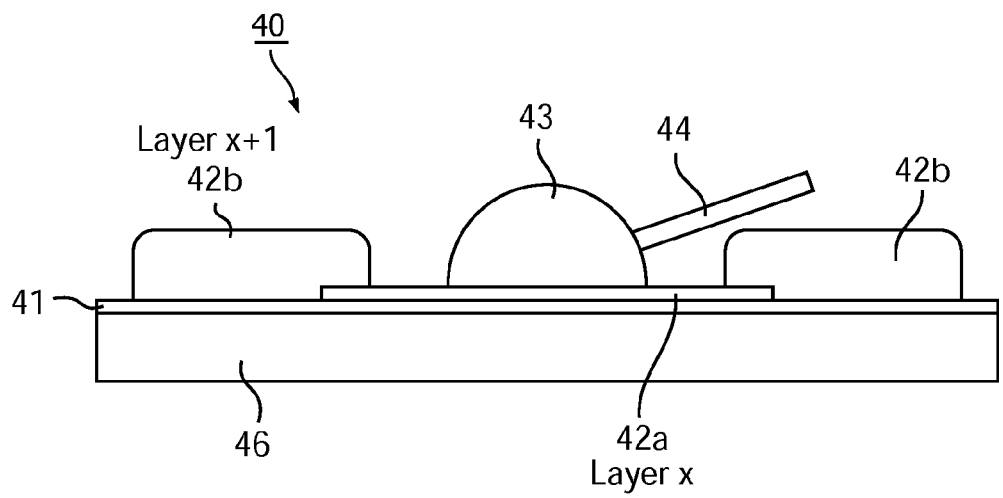
FIG. 4 shows a cross-sectional view a part of an electronic device according to an embodiment of the invention, comprising an additional capping layer, The FIG. 5 shows how f depends on Young's modulus of the compliant substrate, using E=100 GPa (=$10^5$ MPa) for the modulus of the layer.

FIG. 4 shows a cross-sectional view of a part of an electronic device 40 according to an embodiment of the invention comprising an additional capping layer 42 *b*. The layer 42 *b* covering an electrical functioning brittle layer (stack) might keep the contact location functioning and may prevent crack extension outside the contact region. Here a conductive load distributing layer 42 *a* (a yielding metal, like Al, Au or Ag, or a conductive polymer) is applied on the brittle inorganic layer 41 which is arranged on a substrate 46. Just outside the contact site a capping layer 42 *b* is applied. This might be a polymer. For the capping layer 42 *b* a limiting height will be used, such as $E_{cap}h_{cap}<E_1h_1$ (the stiffness of the capping layer is smaller than the stiffness of the load distributing layer 42 *a*). The capping layer 42 *b* covers at least one edge of the covering load distributing layer 42 *a* significantly. An overlap length of layer 42 *a* and the capping layer 42 *b* may, e.g., be $>3\ h_{cap}$.

The present invention is especially useful for lighting device or a display device such as an LED or and OLED device, including flexible opto-electronic devices. Flexible devices, defined as thin devices were found to be significantly improved by the load distributing layer stack, since the risk for crack formation at a contact site is significantly reduced while flexibility still is achieved. Also, the present invention is useful for other electronic devices including brittle layers and contact sites, such as capacitors, transistors and solar cells.

The person skilled in the art realizes that the present invention by no means is limited to the preferred embodiments described above. On the contrary, many modifications and variations are possible within the scope of the appended claims.

For example, alternative embodiments can relate to an electronic device, comprising a first inorganic layer or a multilayered stack of inorganic layers and a load distributing layer stack which comprises more layers in the layer stack than shown in the Figures. Further, the length of a layer x, closer to the inorganic layer 11, may either be larger or smaller than the length of a more distant layer x+1.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. An electronic device comprising:
   a substrate supporting an inorganic layer, wherein the inorganic layer is comprised of an oxide or a nitride,
   a joint, mechanically coupling a contacting element to the inorganic layer, and
   a stack of multiple load distributing layers, said multiple load distributing layers comprising at least a first load distributing layer, a second load distributing layer, and a third distributing layer,
   wherein said stack is arranged to relive stress caused by an elastic mismatch between the substrate and the inorganic layer,
   wherein the first load distributing layer extends along a first plane,
   wherein a first side of said first load distributing layer is arranged in direct contact with a first side of the inorganic layer,
   wherein said second load distributing layer is disposed on a second side opposite said first side,
   wherein a portion of said second load distributing layer extends along a second plane parallel to said first plane,
   wherein said second load distributing layer is disposed between said first load distributing layer and said third load distributing layer,
   wherein said second load distributing layer has a second perimeter,
   wherein said third load distributing layer has a third perimeter,
   wherein a portion of the second perimeter and a portion of the third perimeter extends in a direction perpendicular to said first plane,
   wherein said portion of the second perimeter and said portion of the third perimeter extends from the second plane to a point of contact on the first side of the inorganic layer,
   wherein said portion of the second perimeter and said portion of the third perimeter extends a predetermined distance in a direction parallel to the first plane from the point of contact and away from the joint,
   wherein a thickness h1 of the first load distributing layer is defined by $E_1h_1 \leq q\ E_0h_0$,
   wherein $h_0$ and $h_1$ are the thickness of the inorganic layer and the first load distributing layer respectively, $E_0$ and $E_1$ are the Young moduli of the inorganic layer and the first load distributing layer respectively and q is a limiting number and wherein $0 \leq q \leq 1.0$.

2. An electronic device as claimed in claim 1, wherein at least the first load distributing layer is disposed in between the inorganic layer and the joint.

3. An electronic device as claimed in claim 1, wherein the inorganic layer is disposed in between at least the first load distributing layer and the joint.

4. An electronic device as claimed in claim 1, wherein at least the first load distributing layer comprises at least one of a metal, a semi-conductor, a polymeric material or a combination thereof.

5. An electronic device as claimed in claim 1, wherein the substrate is a polymer layer.

6. An electronic device as claimed in claim 1, wherein a thickness $h_{x+1}$ of a load distributing layer, x+1, in the stack is defined by:

$$E_{x+1}h_{x+1} \le q \sum_{j=0}^{x} E_j h_j,$$

wherein j=0 corresponds to the inorganic layer and 1≤j≤x corresponds to respective load distributing layers closer to the inorganic layer than the third load distributing layer, x+1, wherein $h_j$ is the thickness and $E_j$ is the Young modulus of the corresponding layer and wherein q is a limiting number and wherein 0≤q≤1.0.

7. An electronic device as claimed in claim 6, wherein a largest distance, $L_{x+1}$, between an edge of third load distributing layer x+1 and an edge of said first load distributing layer and an edge of said second load distributing layer is at least $$f \sum_{j=1}^{x} h_j,$$

wherein f is defined by an elastic mismatch, α, between the substrate and the inorganic layer, wherein $f=f_0/(1-\alpha)^r$, $f_0 \ge 2$, $\alpha=(E_0-E_s)/(E_0+E_s)$ and 0.5≤r≤0.75, $E_s$ being the Young modulus of the substrate.

8. An opto-electronic device comprising an electronic device according to claim 1.

9. An electronic device comprising:
a substrate supporting an inorganic layer,
a joint, mechanically coupling a contacting element to the inorganic layer, and
a stack of multiple load distributing layers comprising at least a first load distributing layer, a second load distributing layer, and a third distributing layer,
wherein the stack is arranged to relive stress caused by an elastic mismatch between the substrate and the inorganic layer,
wherein the first load distributing layer extends along a first plane,
wherein a first side of said first load distributing layer is arranged in direct contact with a first side of the inorganic layer,
wherein said second load distributing layer is disposed on a second side of said first load distributing layer opposite said first side,
wherein a portion of said second load distributing layer extends along a second plane parallel to said first plane
wherein said second load distributing layer is disposed between said first load distributing layer and said third load distributing layer,
wherein said second load distributing layer has a second perimeter,
wherein said third load distributing layer has a third perimeter,
wherein a portion of the second perimeter and a portion of the third perimeter extends in a direction perpendicular to said first plane,
wherein said portion of the second perimeter and said portion of the third perimeter extends from the second plane to a point of contact on the first side of the inorganic layer,
wherein said portion of the second perimeter and said portion of the third perimeter extends a predetermined distance in a direction parallel to the first plane from the point of contact and away from the joint,
wherein a thickness $h_1$ of the first load distributing layer is defined by:

$$E_1 h_1 \le q E_0 h_0,$$

wherein $h_0$ and $h_1$ are the thickness of the inorganic layer and the first load distributing layer respectively, $E_0$ and $E_1$ are the Young moduli of the inorganic layer and the first load distributing layer respectively and q is a limiting number and wherein 0≤q≤1.0.

10. An electronic device comprising:
a substrate supporting an inorganic layer,
a joint, mechanically coupling a contacting element to the inorganic layer, and
a stack of multiple load distributing layers, said multiple load distributing layers comprising at least a first load distributing layer, a second load distributing layer, and a third distributing layer,
wherein said stack is arranged to relive stress caused by an elastic mismatch between the substrate and the inorganic layer,
wherein the first load distributing layer extends along a first plane,
wherein a first side of said first load distributing layer is arranged in direct contact with a first side of the inorganic layer,
wherein said second load distributing layer is disposed on a second side opposite said first side,
wherein a portion of said second load distributing layer extends along a second plane parallel to said first plane,
wherein said second load distributing layer is disposed between said first load distributing layer and said third load distributing layer,
wherein said second load distributing layer has a second perimeter,
wherein said third load distributing layer has a third perimeter,
wherein a portion of the second perimeter and a portion of the third perimeter extends in a direction perpendicular to said first plane,
wherein said portion of the second perimeter and said portion of the third perimeter extends from the second plane to a point of contact on the first side of the inorganic layer,
wherein said portion of the second perimeter and said portion of the third perimeter extends a predetermined distance in a direction parallel to the first plane from the point of contact and away from the joint,
wherein a thickness $h_{x+1}$ of a load distributing layer, x+1, in the stack is defined by:

$$E_{x+1}h_{x+1} \le q \sum_{j=0}^{x} E_j h_j,$$

wherein j=0 corresponds to the inorganic layer and 1≤j≤x corresponds to respective load distributing layers closer to the inorganic layer than the third load distributing layer, x+1, wherein $h_j$ is the thickness and $E_j$ is the Young modulus of the corresponding layer and wherein q is a limiting number and wherein 0≤q≤1.0.

11. An electronic device as claimed in claim 10, wherein a largest distance, $L_{x+1}$, between an edge of third load distributing layer x+1 and an edge of said first load distributing layer and an edge of said second load distributing layer is at least $$f \sum_{j=1}^{x} h_j,$$

wherein f is defined by an elastic mismatch, $\alpha$, between the substrate and the inorganic layer, wherein $f=f_0/(1-\alpha)^r$, $f_0 \leq 2$, $\alpha=(E_0-E_s)/(E_0+E_s)$ and $0.5 \leq r \leq 0.75$, $E_s$ being the Young modulus of the substrate.

* * * * *